US012563730B2

(12) United States Patent
Wang et al.

(10) Patent No.:  US 12,563,730 B2
(45) Date of Patent:  Feb. 24, 2026

(54) THREE-DIMENSIONAL STORAGE HAVING CONNECTING STRUCTURES

(71) Applicant: YANGTZE MEMORY TECHNOLOGIES CO., LTD., Wuhan (CN)

(72) Inventors: Erwei Wang, Wuhan (CN); Xiaofen Zheng, Wuhan (CN); Lixun Gu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 651 days.

(21) Appl. No.: 17/953,118

(22) Filed: Sep. 26, 2022

(65) Prior Publication Data

US 2023/0018927 A1      Jan. 19, 2023

Related U.S. Application Data

(63) Continuation of application No. PCT/CN2021/132533, filed on Nov. 23, 2021.

(30) Foreign Application Priority Data

Jan. 4, 2021    (CN) .......................... 202110002865.1

(51) Int. Cl.
    *H10B 41/27*          (2023.01)
    *H10B 41/10*          (2023.01)
             (Continued)

(52) U.S. Cl.
    CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
    CPC ........ H10B 43/27; H10B 41/10; H10B 41/27; H10B 41/35; H10B 43/10; H10B 43/35
    See application file for complete search history.

(56) References Cited

U.S. PATENT DOCUMENTS

| | | | | |
|---|---|---|---|---|
| 2017/0148800 A1* | 5/2017 | Nishikawa | ............. | H10B 43/27 |
| 2017/0148810 A1* | 5/2017 | Kai | ........................ | H10B 43/35 |
| 2020/0082886 A1* | 3/2020 | Huo | ........................ | H10B 43/40 |

FOREIGN PATENT DOCUMENTS

| | | | | |
|---|---|---|---|---|
| CN | 108140643 A | 6/2018 | | |
| CN | 110137175 A * | 8/2019 | ............. | H10B 43/27 |

(Continued)

OTHER PUBLICATIONS

Translation of Liu (CN 111048517 A) (Year: 2020).*

(Continued)

*Primary Examiner* — William B Partridge
*Assistant Examiner* — Ilker Ozden
(74) *Attorney, Agent, or Firm* — BAYES PLLC

(57) ABSTRACT

A method for manufacturing a three-dimensional storage includes: providing a substrate; forming a first connecting layer and a first sacrificial layer; etching part of the first sacrificial layer to form first grooves and second grooves; forming first connecting structures in the first grooves and second connecting structures in the second grooves; forming a second connecting layer on the first sacrificial layer, the second connecting layer filling up the first and second grooves; forming a stacked structure on a surface of the second connecting layer; forming a channel structure and a gate line slit penetrating the stacked structure and extending to the first sacrificial layer; removing the first sacrificial layer and a part of the channel structure corresponding to the first sacrificial layer by the gate line slit to form an opening (Continued)

region; and forming an epitaxial structure layer in the opening region through the gate line slit.

20 Claims, 20 Drawing Sheets

(51) Int. Cl.
*H10B 41/35* (2023.01)
*H10B 43/10* (2023.01)
*H10B 43/27* (2023.01)
*H10B 43/35* (2023.01)

(56) References Cited

FOREIGN PATENT DOCUMENTS

| | | | | | |
|---|---|---|---|---|---|
| CN | 111048517 | A | * | 4/2020 | ............. H10B 41/35 |
| CN | 111341780 | A | | 6/2020 | |
| CN | 112071851 | A | * | 12/2020 | ............. H10B 43/27 |
| CN | 112838095 | A | | 5/2021 | |
| CN | 108140643 | B | * | 3/2022 | ........... H10D 30/696 |

OTHER PUBLICATIONS

Translation of Kong (CN 112071851 A) (Year: 2020).*
MKS Instruments Handbook, 2nd Edition, 2017, pp. 35-41, https://www.mks.com/n/silicon-epitaxial-thin-films (Year: 2017).*
Translation of Zhao (CN 110137175 A) (Year: 2019).*
Translation of Zhang (CN 108140643 B) (Year: 2018).*
Translation of CN 111048517 A. (Year: 2020).*
Translation of CN 112071851 A. (Year: 2020).*

* cited by examiner

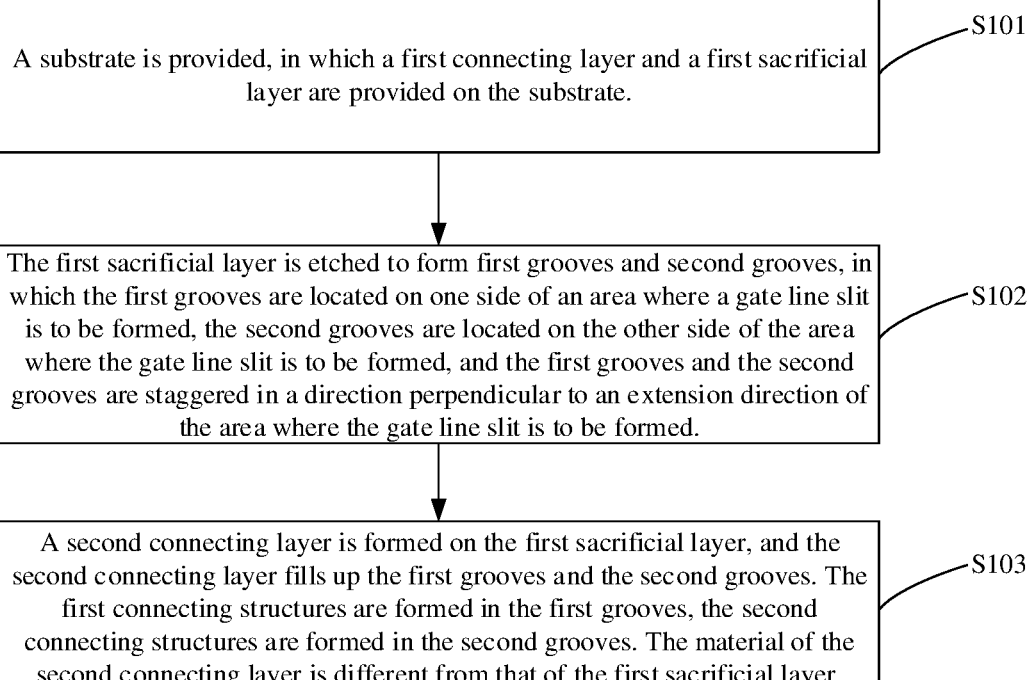

A substrate is provided, in which a first connecting layer and a first sacrificial layer are provided on the substrate.    S101

The first sacrificial layer is etched to form first grooves and second grooves, in which the first grooves are located on one side of an area where a gate line slit is to be formed, the second grooves are located on the other side of the area where the gate line slit is to be formed, and the first grooves and the second grooves are staggered in a direction perpendicular to an extension direction of the area where the gate line slit is to be formed.    S102

A second connecting layer is formed on the first sacrificial layer, and the second connecting layer fills up the first grooves and the second grooves. The first connecting structures are formed in the first grooves, the second connecting structures are formed in the second grooves. The material of the second connecting layer is different from that of the first sacrificial layer.    S103

FIG. 4

THREE-DIMENSIONAL STORAGE HAVING CONNECTING STRUCTURES

CROSS-REFERENCE TO RELATED APPLICATIONS

This application is a continuation application of International Application No. PCT/CN2021/132533, filed on Nov. 23, 2021, which claims the benefit of priority to Chinese Application No. 202110002865.1, filed on Jan. 4, 2021. The entire contents of each of the above-referenced applications are expressly incorporated herein by reference.

BACKGROUND

In three-dimensional storage (3D NAND), storage units are stacked in a direction perpendicular to the substrate, which can form more storage units in a smaller area. Compared with the traditional two-dimensional storage, it has a larger storage capacity, and is a major development direction in the prior field of storage.

In the process of manufacturing three-dimensional storage, manufacturing a stacked structure on the substrate is required, in which the stacked structure includes multiple oxide layers and nitride layers alternately arranged. With the increasing demand for capacity of three-dimensional storage, in order to obtain a larger storage capacity on unit chip area, it is necessary to increase the number of stacked layers in the stacked structure of three-dimensional storage, which makes it more difficult to ensure the structural stability in each process during manufacturing three-dimensional storage, and seriously restricts the development of three-dimensional storage technology.

SUMMARY

The disclosure relates to the technical field of semiconductor manufacturing, and in particular to a three-dimensional storage and a method for manufacturing same.

The disclosure provides a three-dimensional storage and a method for manufacturing the same.

A method for manufacturing a three-dimensional storage includes the following operations.

A substrate is provided, in which a first connecting layer and a first sacrificial layer stacked in sequence are formed on the substrate.

Part of the first sacrificial layer is etched to form first grooves and second grooves, in which the first grooves are located on one side of a first area and the second grooves are located on another side of the first area.

First connecting structures are formed in the first grooves and second connecting structures are formed in the second grooves, and meanwhile a second connecting layer is formed on the first sacrificial layer, in which a material of the second connecting layer, a material of the first connecting structures and a material of the second connecting structures are same and are different from a material of the first sacrificial layer.

A stacked structure is formed on a surface of the second connecting layer.

A channel structure and a gate line slit penetrating through the stacked structure and extending to the first sacrificial layer are formed, in which a projection of the gate line slit on a plane where the first sacrificial layer is located overlaps with the first area.

The first sacrificial layer and a part of the channel structure corresponding to the first sacrificial layer are removed by the gate line slit to form an opening region, in which the first connecting structures and the second connecting structures are retained when the first sacrificial layer and the part of the channel structure are removed.

An epitaxial structure layer is formed in the opening region through the gate line slit, in which the epitaxial structure layer is connected with a channel layer inside the channel structure.

A three-dimensional storage includes a substrate; a connecting structure and a stacked structure located on the substrate.

A channel structure and a gate line penetrating through the stacked structure and extending to a first connecting layer are provided in the stacked structure.

The connecting structure includes a first connecting layer, an epitaxial structure layer, and a second connecting layer located on the substrate in sequence, and the epitaxial structure layer is connected with a channel layer inside the channel structure.

First connecting structures and second connecting structures are provided in the epitaxial structure layer, in which the first connecting structures are located on one side of the gate line and the second connecting structures are located on the other side of the gate line.

A material of the second connecting layer, a material of the first connecting structures, and a material of the second connecting structures are the same.

BRIEF DESCRIPTION OF THE DRAWINGS

In order to more clearly illustrate the embodiments of the disclosure or the technical solution in the prior art, a brief description of the drawings for use in the description of embodiments or the prior art is provided below. Apparently, the drawings in the following description are merely some embodiments of the disclosure. For a person of ordinary skilled in the art, other drawings can be obtained based on these drawings without creative work.

FIG. 4 is a flow chart of a method for manufacturing a three-dimensional storage provided by an embodiment of the disclosure.

DETAILED DESCRIPTION

With the increase in the number of stacked layers of a stacked structure in the three-dimensional storage, it is increasingly difficult to ensure structural stability in each process during manufacturing the three-dimensional storage.

Figure 1:
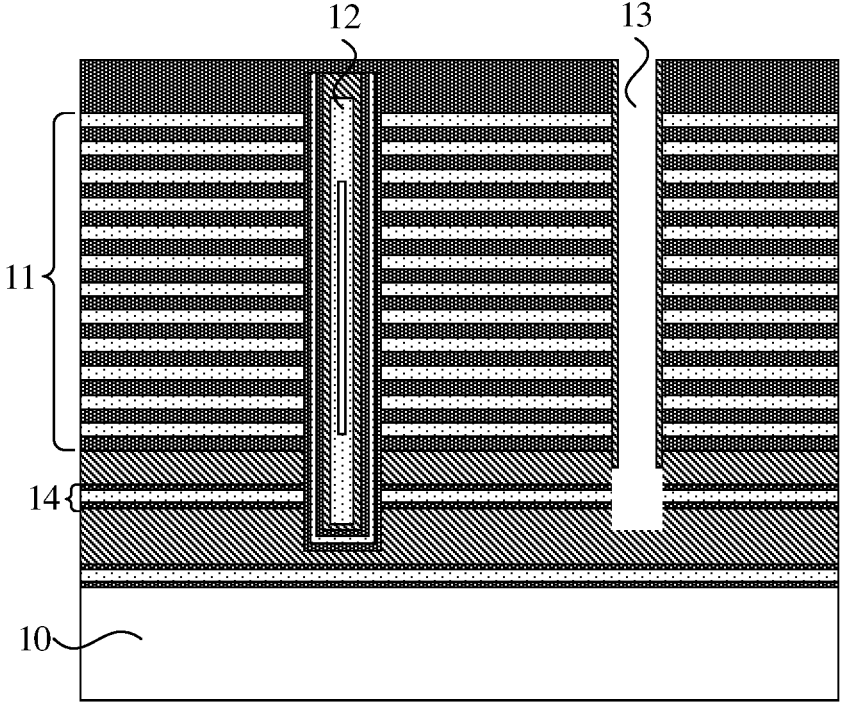
FIGS. 1-3 are structural schematic diagrams in the process of manufacturing a three-dimensional storage.
Figure 2:
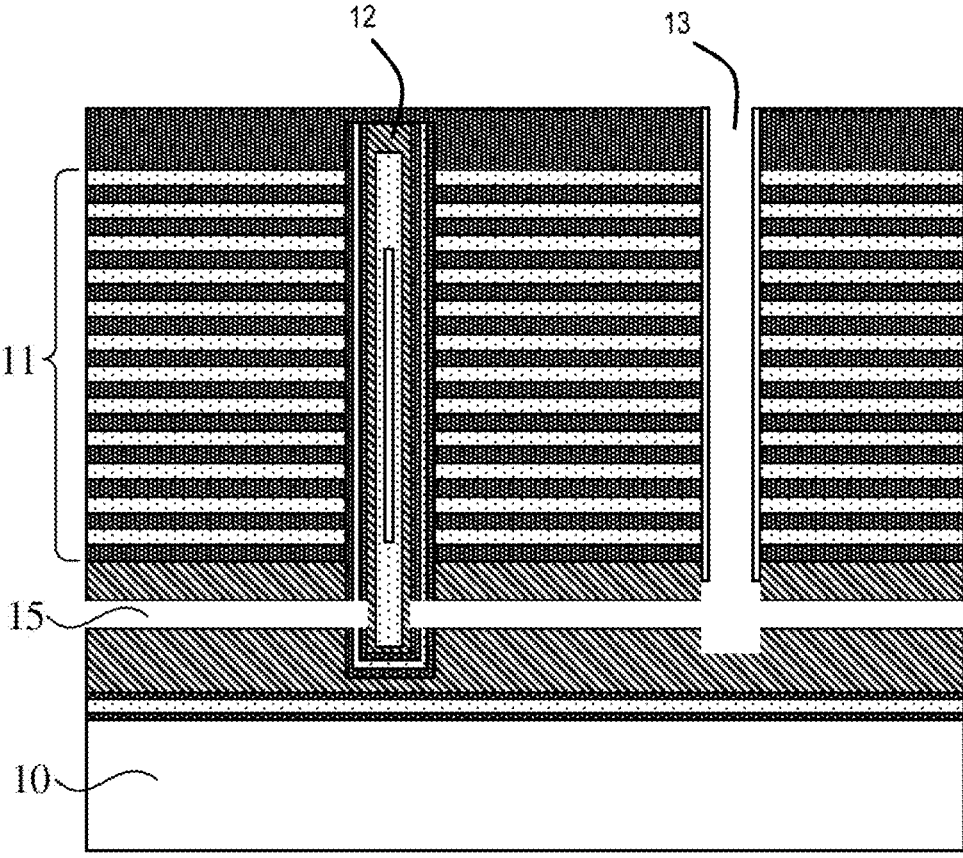
Figure 3:
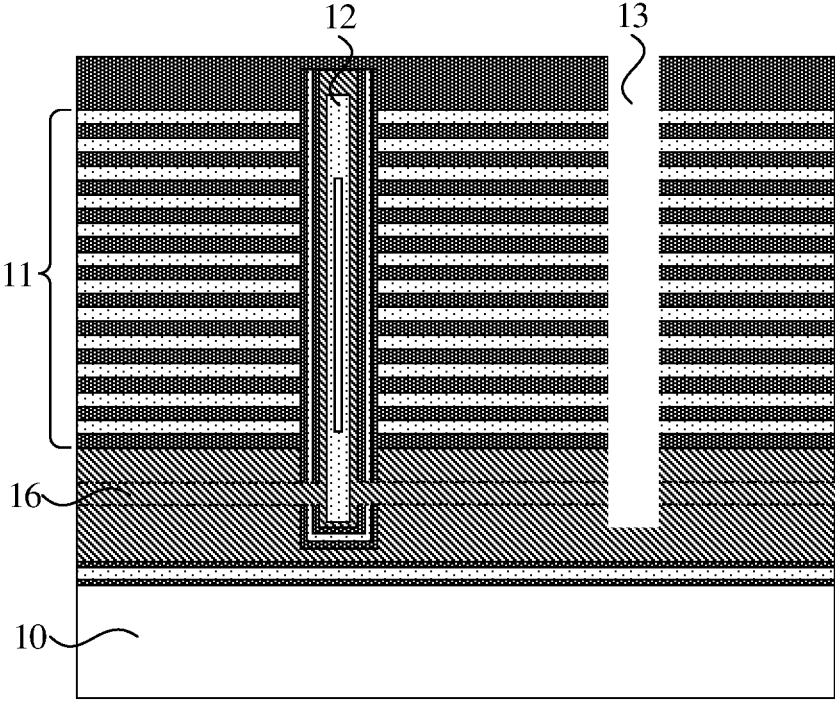

In the process of manufacturing a three-dimensional storage, as shown in FIG. 1, usually a stacked structure 11, a channel structure 12, and a gate line slit (GLS) 13 penetrating through the stacked structure 11 are firstly formed on the substrate 10. Subsequently, as shown in FIG. 2, etching gas or etching solution is introduced through the gate line slit 13 to etch the sacrificial layer 14 between the substrate 10 and the stacked structure 11, to form an opening region 15. Then, as shown in FIG. 3, an epitaxial structure layer 16 is formed in the opening region 15 by the selective epitaxial growth technics.

However, after the sacrificial layer 14 is etched away, as shown in FIG. 2, the bottom of the stacked structure 11 is only supported by a part of the channel structure 12, and most of the stacked structure 11 is suspended. As the number of stacked layers of the stacked structure 11 increases, the risk of fracture or collapse of the stacked structure 11 becomes larger, which causes structural instability during the process of manufacturing the three-dimensional storage, resulting in poor performance of the finally-formed three-dimensional storage.

In view of this, the disclosure provides a three-dimensional storage and a method for manufacturing the same, to overcome the above-mentioned problems existing in the prior art, the method includes the following operations.

A substrate is provided, in which a first connecting layer and a first sacrificial layer are provided on the substrate.

The first sacrificial layer is etched to form first grooves and second grooves, in which the first grooves are located on one side of an area where a gate line slit is to be formed, the second grooves are located on the other side of the area where the gate line slit is to be formed, and the first grooves and the second grooves are staggered in a direction perpendicular to an extension direction of the area where the gate line slit is to be formed.

A second connecting layer is formed on the first sacrificial layer, and the second connecting layer fills up the first grooves and the second grooves. First connecting structures are formed in the first grooves and second connecting structures are formed in the second grooves. The material of the second connecting layer is different from that of the first sacrificial layer.

Since the material of the second connecting layer is different from that of the first sacrificial layer, the first connecting structures, and the second connecting structures, it can be retained when the first sacrificial layer is etched. Since the first connecting structures are located on one side of the area where the gate line slit is to be formed, the second connecting structures are located on the other side of the area where the gate line slit is to be formed, and the first connecting structures and the second connecting structures are staggered in the direction perpendicular to the extension direction of the area where the gate line slit is to be formed, the first connecting structures and the second connecting structures can support the stacked structure thereon, thereby reducing the risk of fracture or collapse of the stacked structure and ensuring the stability of the structure in the process of manufacturing the three-dimensional storage.

The above is the core concept of the disclosure. In order to make the objects, features, and advantages of the disclosure clear and understandable, a description of the technical solutions is provided below with reference to the drawings. Apparently, the embodiments are only a part of the embodiments of the disclosure, not all the embodiments. Based on the embodiments in the disclosure, other embodiments obtained by those of ordinary skill in the art without making creative effort fall within the scope of protection of the disclosure.

An embodiment of the disclosure provides a method for manufacturing a three-dimensional storage. As shown in FIG. 4, the method includes the following operations.

At S101, a substrate is provided, in which a first connecting layer and a first sacrificial layer are provided on the substrate.

In an embodiment of the disclosure, the material of the substrate may be monocrystalline silicon (Si), single crystal germanium (Ge) or silicon germanium (SiGe), silicon on insulator (SOI), germanium on insulator (GOI), or other materials, such as compounds of Groups III-V including gallium arsenide or compounds of Group II-VI.

Figure 5:
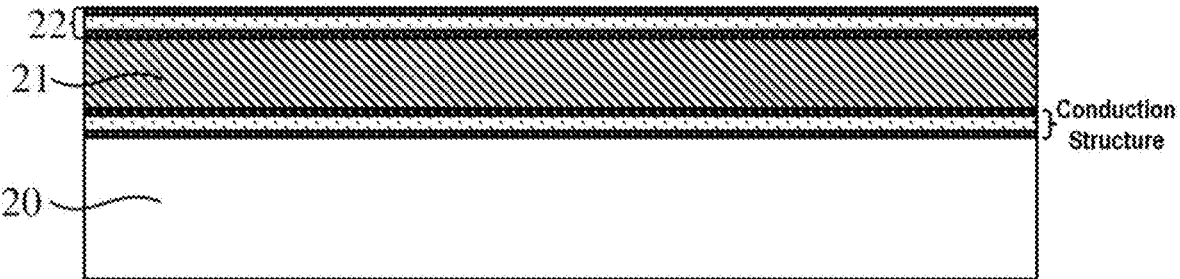
FIGS. 5-20 are structural schematic diagrams in the process of manufacturing a three-dimensional storage provided by an embodiment of the disclosure.

As shown in FIG. 5, a first connecting layer 21 and a first sacrificial layer 22 are provided on the substrate 20. In some embodiments, the material of the first connecting layer 21 is polysilicon. The first sacrificial layer 22 includes a silicon oxide layer, a silicon nitride layer, and a silicon oxide layer arranged in sequence on the substrate. In an embodiment of the disclosure, a conduction structure is further provided between the substrate 20 and the first connecting layer 21. The conduction structure is configured to realize an electrical connection between a channel structure and an external circuit.

At S102, the first sacrificial layer is etched to form first grooves and second grooves, in which the first grooves are located on one side of an area where a gate line slit is to be formed, and the second grooves are located on the other side of the area where the gate line slit is to be formed, and the first grooves and the second grooves are staggered in a direction perpendicular to an extension direction of the area where the gate line slit is to be formed.

Figure 6:
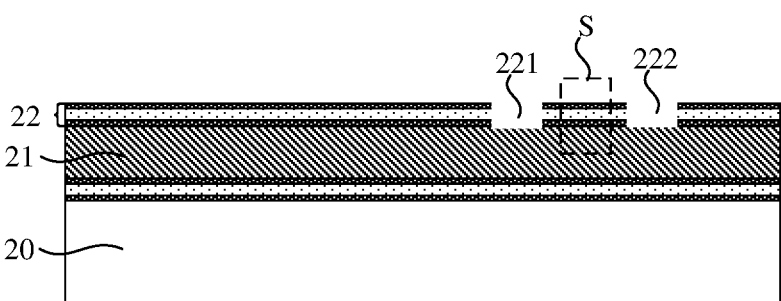
Figure 7:
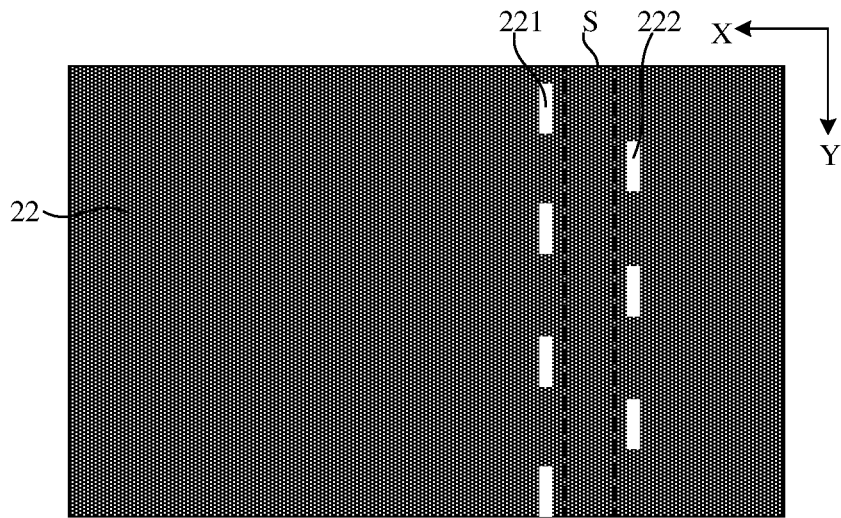

As shown in FIG. 6, the first sacrificial layer 22 is etched to form first grooves 221 and second grooves 222. As shown in FIG. 6 and FIG. 7, the first grooves 221 are located on one side of an area S where a gate line slit is to be formed, and the second grooves 222 are located on the other side of the area S where the gate line slit is to be formed, and the first grooves 221 and the second grooves 222 are staggered in a direction perpendicular to an extension direction of the area S where the gate line slit is to be formed. As shown in FIG. 7, the first grooves 221 and the second grooves 222 are staggered in the direction X, which is perpendicular to the extension direction Y of the area S where the gate line slit is to be formed.

In some embodiments of the disclosure, etching the first sacrificial layer 22 to form the first grooves 221 and the second grooves 222 includes the following operation.

The first sacrificial layer 22 is etched to form a plurality of the first grooves 221 and a plurality of the second grooves 222, in which the plurality of the first grooves 221 are arranged in sequence on one side of the area S where the gate line slit is to be formed, the plurality of the second grooves 222 are arranged in sequence on the other side of the area S where the gate line slit is to be formed, and any one of the first grooves 221 and any one of the second grooves 222 are staggered in the direction perpendicular to the extension direction of the area S where the gate line slit is to be formed, so that the etching gas or solution introduced into the gate line slit formed subsequently can extend towards the left and right sides through the staggered gap between the first grooves 221 and the second grooves 222, to etch film layers on the left and right sides of the gate line slit.

In some embodiments, the first grooves 221 and the second grooves 222 are circular grooves or square grooves.

At S103, a second connecting layer is formed on the first sacrificial layer, and the second connecting layer fills up the first grooves and the second grooves. First connecting structures are formed in the first grooves and second connecting structures are formed in the second grooves. The material of the second connecting layer is different from that of the first sacrificial layer.

Figure 8:
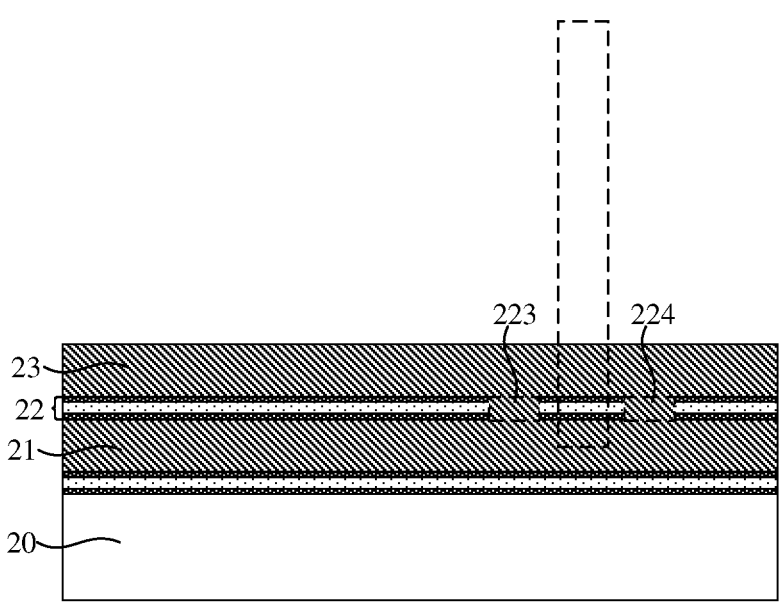

As shown in FIG. 8, a second connecting layer 23 is formed on the first sacrificial layer 22, and the second connecting layer 23 fills up the first grooves 221 and the second grooves 222. First connecting structures 223 are formed in the first grooves 221 and second connecting structures 224 are formed in the second grooves 222. The material of the second connecting layer 23 is different from that of the first sacrificial layer 22. In some embodiments, the material of the second connecting layer 23 is polysilicon.

In some embodiments of the disclosure, after the second connecting layer 23 is formed on the first sacrificial layer 22, the method further includes the following operation.

Chemical mechanical polishing is carried out on the surface of the second connecting layer 23 so that the surface of the second connecting layer 23 is a flat surface.

In the embodiment of the disclosure, the first grooves 221 are located on one side of the area S where the gate line slit is to be formed, and the second grooves 222 are located on the other side of the area S where the gate line slit is to be formed. The first grooves 221 and the second grooves 222 are staggered in the direction perpendicular to the extension direction of the area S where the gate line slit is to be formed. Therefore, the first connecting structures 223 are located on one side of the area S where the gate line slit is to be formed, the second connecting structures 224 are located on the other side of the area S where the gate line slit is to be formed, and the first connecting structures 223 and the second connecting structures 224 are staggered in the direction perpendicular to the extension direction of the area S where the gate line slit is to be formed. Since the material of the second connecting layer 23 is different from that of the first sacrificial layer 22, during etching the first sacrificial layer 22, the first connecting structures 223 and the second connecting structure 224 can be retained, so that the first connecting structures 223 and the second connecting structures 224 can support the stacked structure thereon, thereby reducing the risk of fracture or collapse of the stacked structure and ensuring the stability of the structure in the process of manufacturing the three-dimensional storage.

Moreover, since the first connecting structures 223 and the second connecting structures 224 are formed in the process of forming the second connecting layer 23, materials can be saved, and process costs can be reduced.

In some embodiments of the disclosure, after the second connecting layer 23 is formed, the method further includes the following operations.

At S201, a stacked structure is formed on the surface of the second connecting layer, in which the stacked structure includes multiple second sacrificial layers and multiple isolation layers which are alternately arranged.

At S202, a channel structure and a gate line slit penetrating through the stacked structure are formed in the stacked structure, in which the area of the gate line slit corresponds to the area where the gate line slit is to be formed, and the channel structure and the gate line slit extend to the first connecting layer on the bottom of the first sacrificial layer.

At S203, the first sacrificial layer and part of the channel structure corresponding to the first sacrificial layer are removed by the gate line slit to form an opening region, in which the first connecting structures and the second connecting structures are retained, and the opening region extends to a channel layer inside the channel structure.

At S204, an epitaxial structure layer is formed in the opening region by the gate line slit, in which the epitaxial structure layer is connected with the channel layer inside the channel structure.

In some embodiments of the disclosure, forming the channel structure penetrating through the stacked structure in the stacked structure includes the following operations.

A channel hole penetrating through the stacked structure is formed in the stacked structure, in which the channel hole extends to the first connecting layer on the bottom of the first sacrificial layer.

A barrier layer, a charge trapping layer, a tunneling layer, and a channel layer are formed sequentially on the bottom and sidewall of the channel hole.

In some embodiments of the disclosure, forming the gate line slit penetrating through the stacked structure in the stacked structure includes the following operations.

The gate line slit penetrating through the stacked structure is formed in the stacked structure, in which the gate line slit extends to the second connecting layer.

A shielding layer is formed on the bottom and sidewall of the gate line slit, in which the material of the shielding layer is the same as that of the second connecting layer.

The shielding layer and the second connecting layer on the bottom of the gate line slit are etched, so that the gate line slit extends to the first connecting layer on the bottom of the first sacrificial layer.

The exemplary process is illustrated below in combination with the structural diagram of the three-dimensional storage. It should be noted that in the embodiments of the disclosure, only one channel structure and one gate line slit are illustrated as an example, and it can be understood that in practical applications, the three-dimensional storage includes multiple channel structures and multiple gate line slits, and other channel structures and the structures of other gate line slits are the same as the following structures and will not be repeated here.

Figure 9:
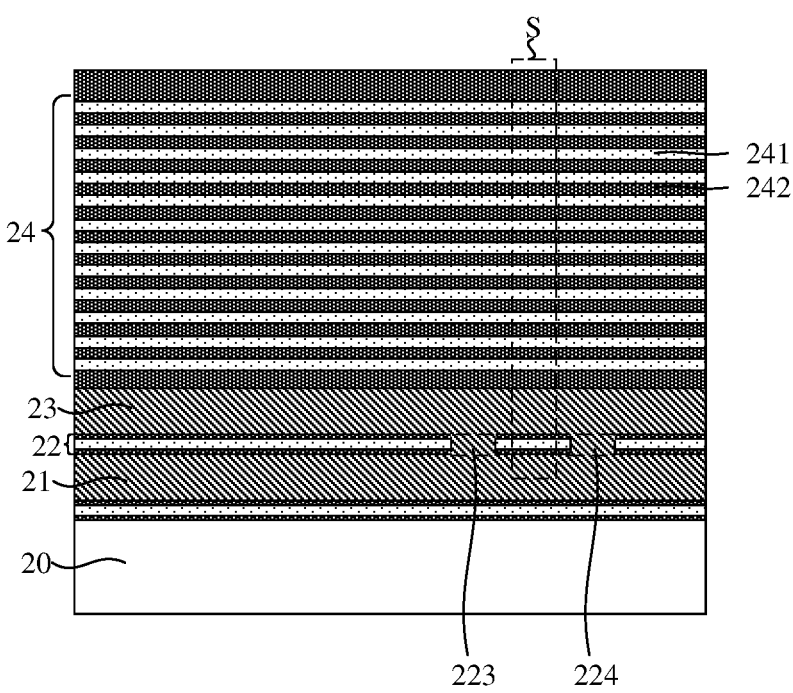

As shown in FIG. 9, a stacked structure 24 is formed on the surface of the second connecting layer 23, in which the stacked structure 24 includes multiple second sacrificial layers 241 and multiple isolation layers 242 which are alternately arranged. The second sacrificial layer 241 includes but is not limited to a silicon nitride layer, the isolation layer 242 includes but is not limited to a silicon oxide layer. The number of stacked layers of the second sacrificial layers 241 and the isolation layers 242 may be 8, 32, or 64. The more stacked layers, the higher the integration level, and the larger the capacity of the three-dimensional storage.

Figure 10:
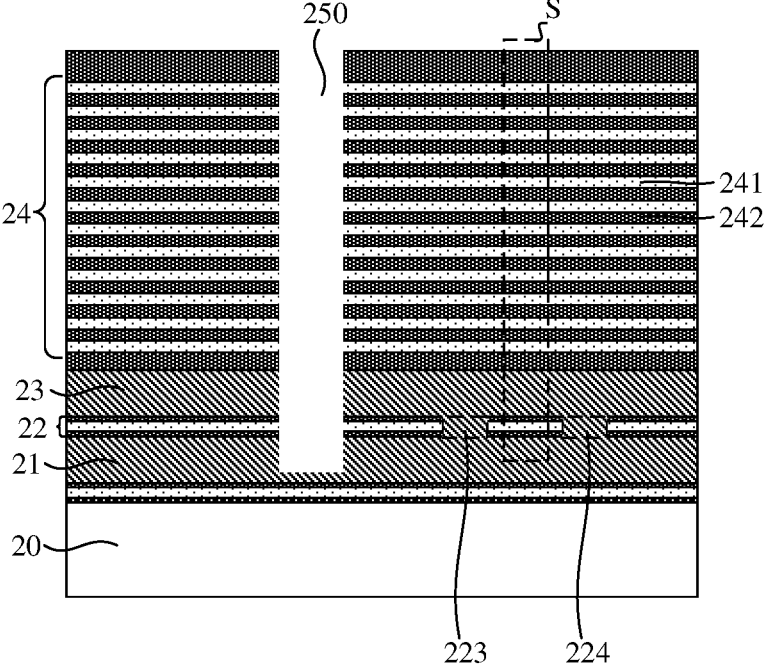
Figure 11:
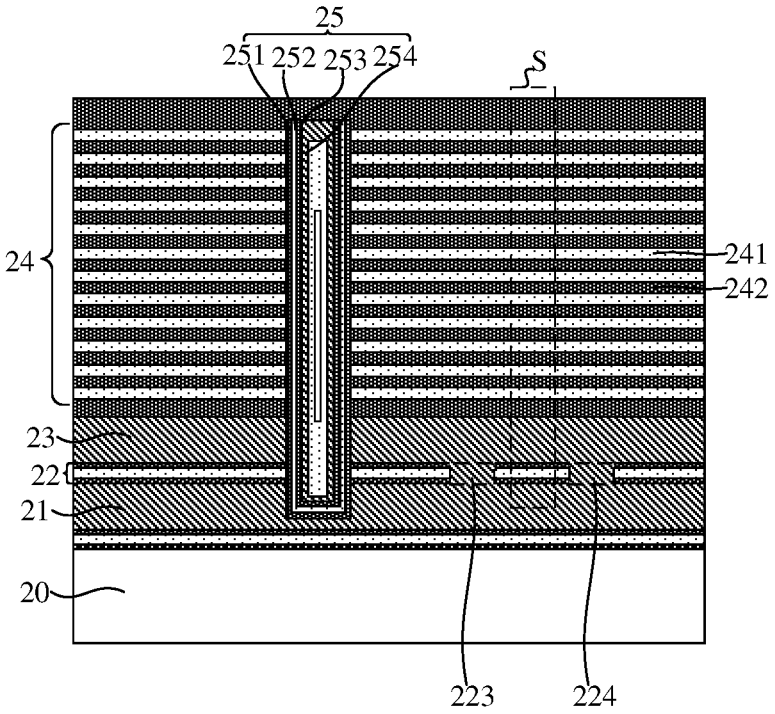

Subsequently, as shown in FIG. 10, a channel hole 250 penetrating through the stacked structure 24 is formed in the stacked structure 24, in which the channel hole 250 extends to the first connecting layer 21 on the bottom of the first sacrificial layer 22. Then, as shown in FIG. 11, a barrier layer 251, a charge trapping layer 252, a tunneling layer 253, and a channel layer 254 are sequentially formed on the bottom and the sidewall of the channel hole 250, in which, the barrier layer 251, the charge trapping layer 252, the tunneling layer 253 and the channel layer 254 constitute a channel structure 25.

Figure 12:
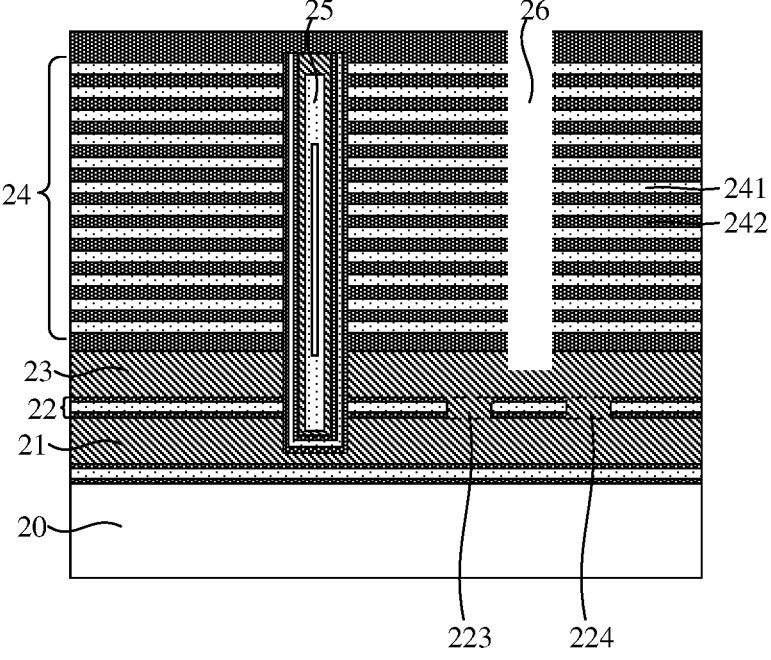

Subsequently, as shown in FIG. 12, a gate line slit 26 penetrating through the stacked structure 24 is formed in the stacked structure 24, in which the gate line slit 26 extends to the second connecting layer 23, the area where the gate line slit 26 is located in the area S where the gate line slit is to be formed.

Figure 13:
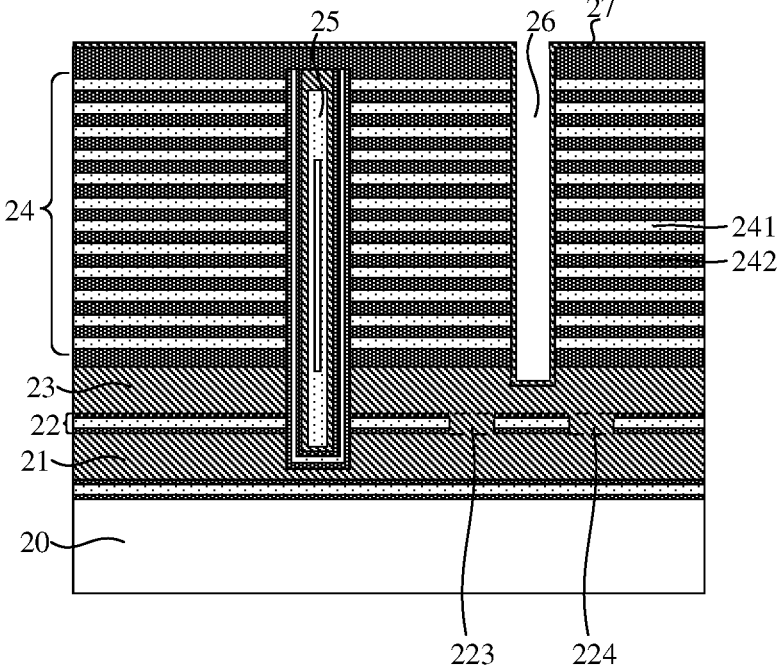
Figure 14:
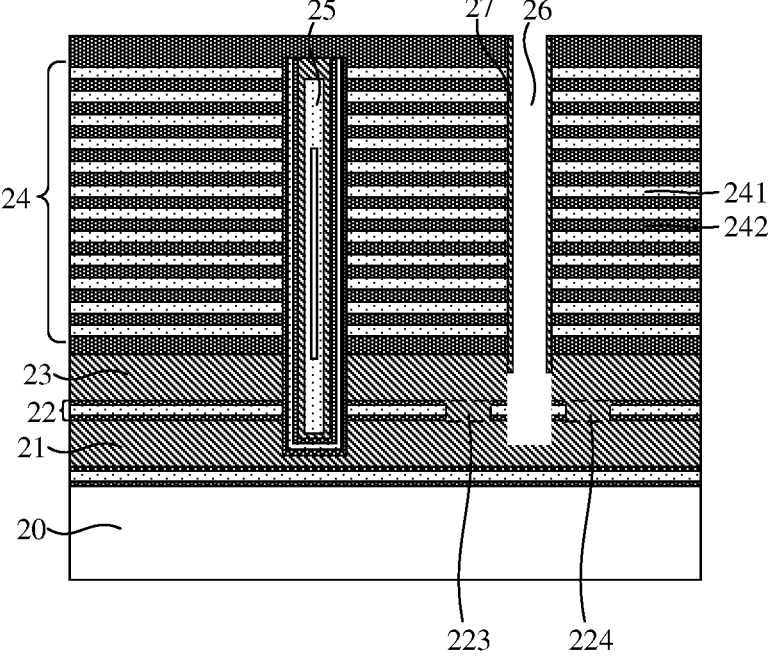

Then, as shown in FIG. 13, a shielding layer 27 is formed on the bottom and the sidewall of the gate line slit 26, and the material of the shielding layer 27 is the same as that of the second connecting layer 23. In some embodiments, the material of the shielding layer 27 is polysilicon. Subsequently, as shown in FIG. 14, the shielding layer 27 and the second connecting layer 23 on the bottom of the gate line slit 26 are etched so that the gate line slit 26 extends to the first connecting layer 21 on the bottom of the first sacrificial layer 22.

Figure 15:
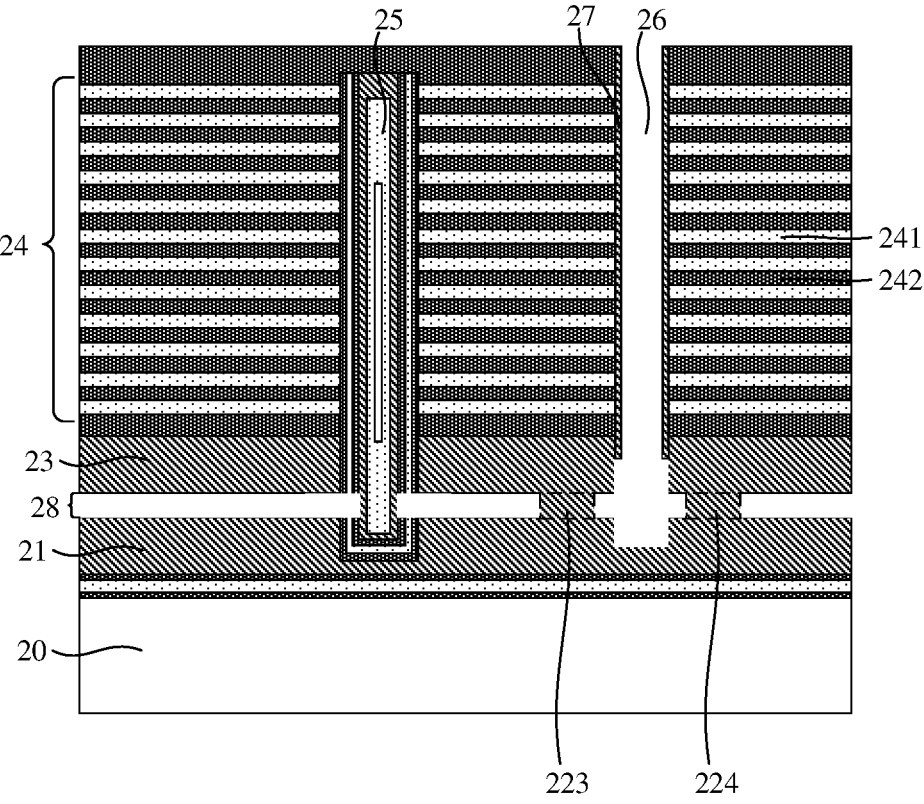

Subsequently, as shown in FIG. 15, the first sacrificial layer 22 and part of the channel structure 25 corresponding to the first sacrificial layer 22 are removed by the gate line slit 26 to form an opening region 28, in which the first connecting structures 223 and the second connecting structures 224 are retained and the opening region 28 extends to the channel layer 254 inside the channel structure 25. It should be noted that, in the embodiment of the disclosure, an etching solution or an etching gas is introduced through the gate line slit 26, and the etching solution or the etching gas only etches the material of the first sacrificial layer 22 and does not etch polysilicon. That is, the first connecting layer 21, the second connecting layer 23, the shielding layer 27, the first connecting structures 223, and the second connecting structures 224 will not be etched. Although the material of the stacked structure 24 is the same as that of the first sacrificial layer 22, under the barrier of the shielding layer 27, the etching solution or the etching gas will not etch the stacked structure 24.

Figure 16:
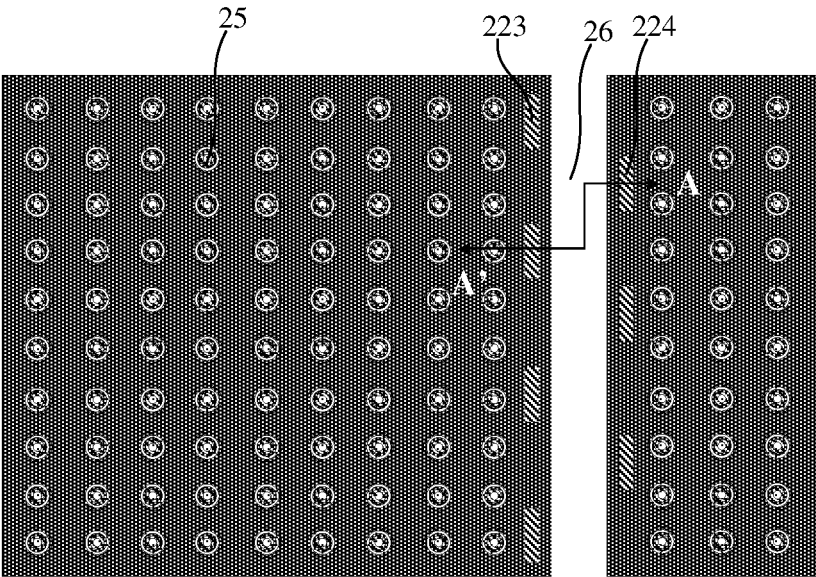

As shown in FIG. 16, since the first connecting structures 223 and the second connecting structures 224 can support the stacked structure thereon, the risk of fracture or collapse of the stacked structure is reduced and the stability of the structure in the process of manufacturing the three-dimensional storage is ensured. The structure as shown in FIG. 15 is a schematic cross-sectional structure diagram of the structure shown in FIG. 16 along the cutting line AA'.

Figure 17:
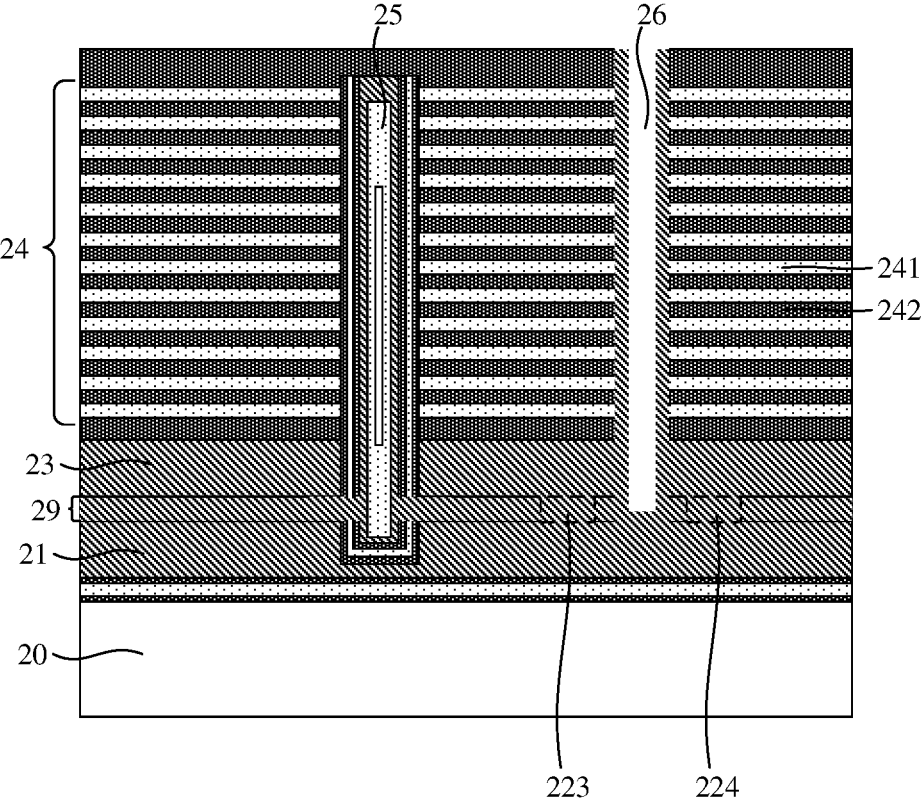

As shown in FIG. 17, an epitaxial structure layer 29 is formed in the opening region 28 by the gate line slit 26 using a selective epitaxial growth process, in which the epitaxial structure layer 29 is connected with the channel layer 254 inside the channel structure 25. It should be noted that the epitaxial structure layer 29 can realize the connection of the channel layers 254 inside a plurality of the channel structures 25, so as to realize the series connection of the plurality of the channel structures 25.

In some embodiments of the disclosure, after the epitaxial structure layer 29 is formed, the method further includes the following operations.

Figure 18:
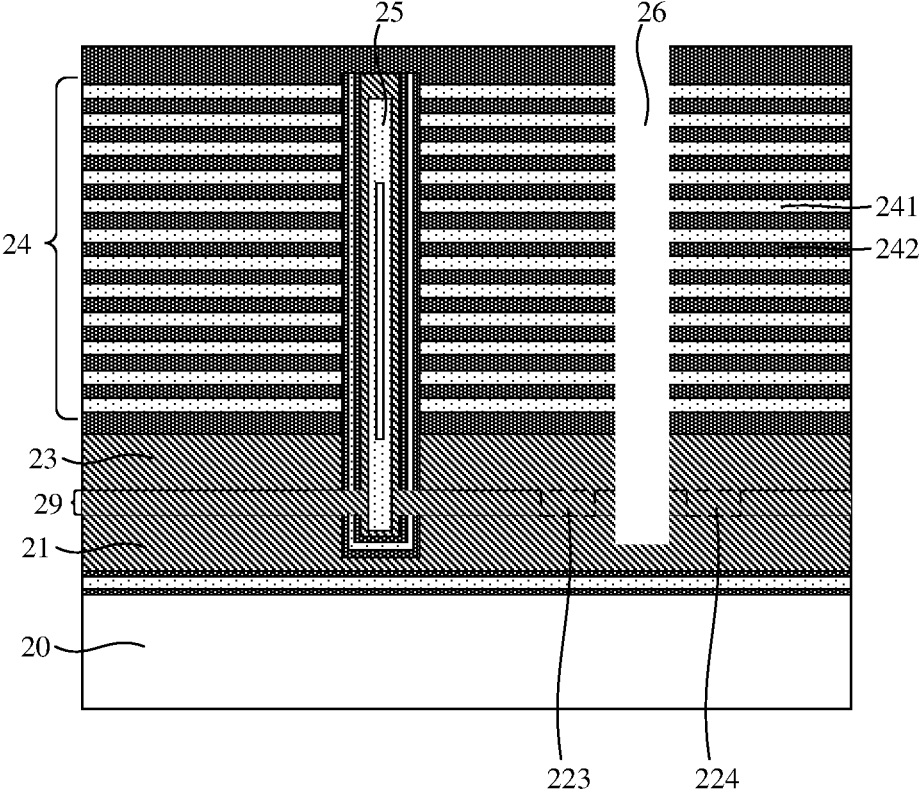
Figure 19:
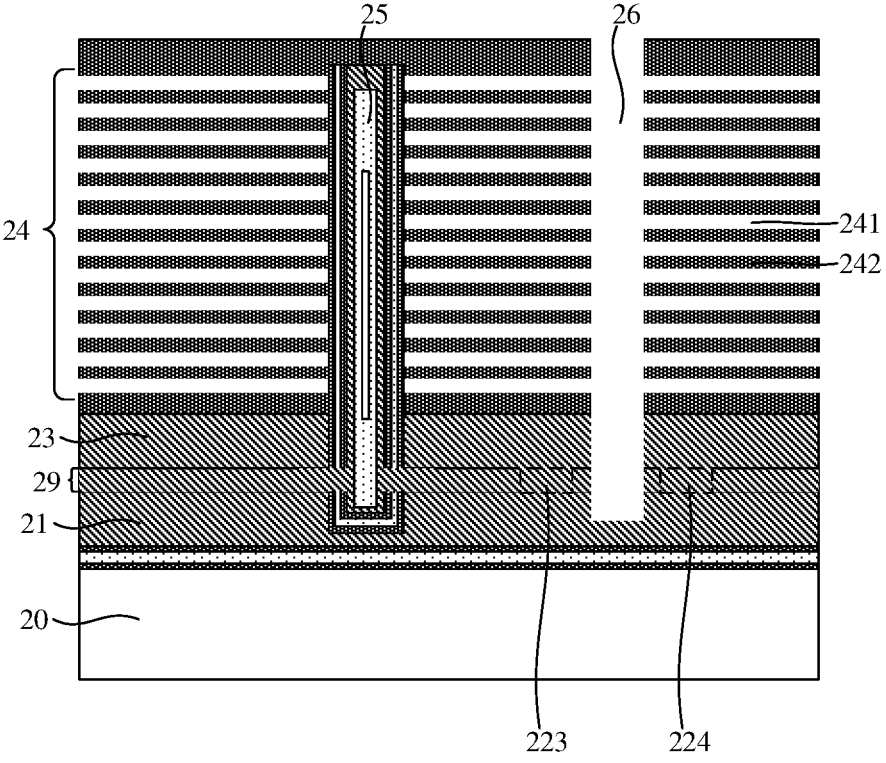
Figure 20:
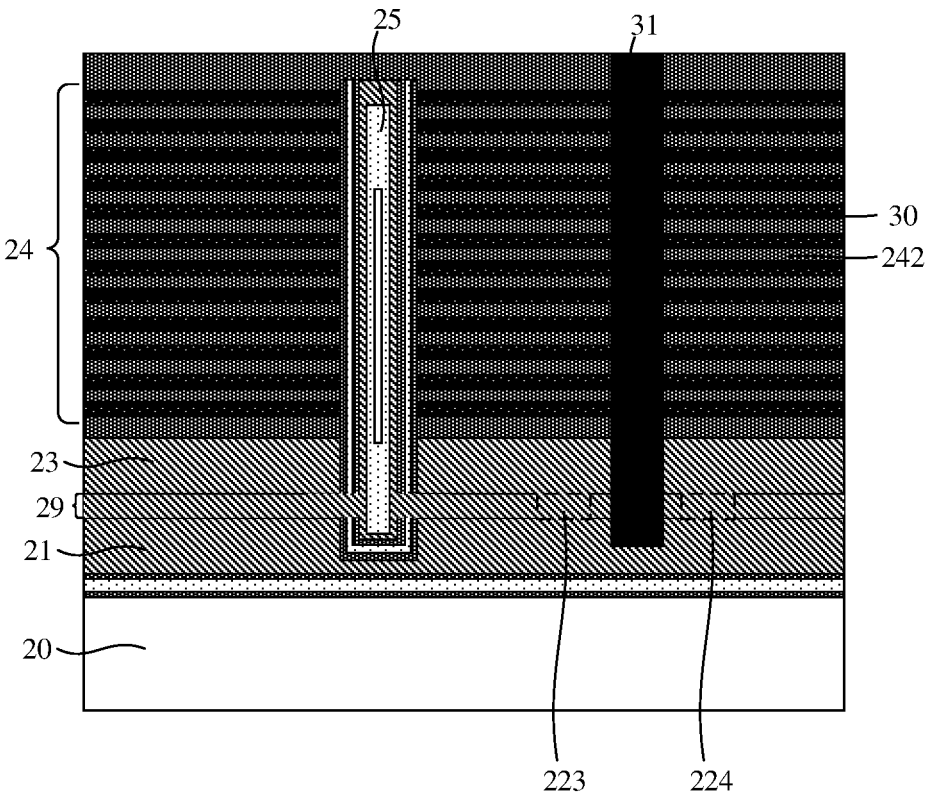

As shown in FIG. 18 and FIG. 19, a film layer inside the gate line slit 26 and the second sacrificial layers 241 of the stacked structure 24 are etched by the gate line slit 26, that is, the etching gas or the etching solution used to etch polysilicon is introduced through the gate line slit 26 to etch the film layer inside the gate line slit 26, exposing the second sacrificial layers 241 in the stacked structure 24, as shown in FIG. 18. Then, as shown in FIG. 19, the etching gas or the etching solution used to etch the second sacrificial layers 241 is introduced through the gate line slit 26 to etch the second sacrificial layers 241 in the stacked structure 24. Then, as shown in FIG. 20, gate 30 is formed in the area where the second sacrificial layers 241 are located and gate line 31 is formed in the gate line slit 26. In some embodiments, the material of the gate 30 and the material of the gate line 31 are metals such as tungsten, copper, or cobalt.

The embodiment of the disclosure further provides a three-dimensional storage which is manufactured by the method provided by any embodiment above. As shown in FIG. 20, the three-dimensional storage includes: a substrate 20; a connecting structure, and a stacked structure 24 located on the substrate 20, in which a channel structure 25 and a gate line 31 penetrating through the stacked structure 24 are provided in the stacked structure 24.

The connecting structure includes a first connecting layer 21, an epitaxial structure layer 29, and a second connecting layer 23 located on the substrate in sequence, and the epitaxial structure layer 29 is connected with a channel layer inside the channel structure 25.

The epitaxial structure layer 29 includes first connecting structures 223 and second connecting structures 224. The first connecting structures 223 are located on one side of the gate line 31, and the second connecting structures 224 are located on the other side of the gate line 31. The first connecting structures 223 and the second connecting structures 224 are staggered in a direction perpendicular to an extension direction of the gate line 31.

Since in the process of manufacturing a three-dimensional storage, the first connecting structures 223 and the second connecting structures 224 can support the stacked structure thereon, the risk of fracture or collapse of the stacked structure 24 is reduced and the stability of the structure in the process of manufacturing the three-dimensional storage is ensured.

Various embodiments in this specification are described and each embodiment focuses on differences from other embodiments. Same and similar parts between the various embodiments can be referred to each other. As for the apparatus disclosed in the embodiment, since it corresponds to the method disclosed in the embodiment, the description thereof is relatively simple, and the relevant parts refer to the description in the method.

The above description of the disclosed embodiments enables those skilled in the art to implement or use the disclosure. Various modifications to these embodiments will be apparent to those skilled in the art, and the general principles defined herein may be implemented in other embodiments without departing from the spirit or scope of the disclosure. Accordingly, the disclosure will not be limited to the embodiments shown herein but is intended to conform to the widest scope consistent with the principles and novel features disclosed herein.

The invention claimed is:

1. A three-dimensional storage, comprising:
a substrate; and
a connecting structure and a stacked structure on the substrate,
wherein the stacked structure comprises a channel structure and a gate line penetrating through the stacked structure and extending to a first connecting layer;
the connecting structure comprises the first connecting layer, an epitaxial structure layer, and a second connecting layer located on the substrate in sequence,
wherein the epitaxial structure layer is connected with a channel layer inside the channel structure; and
the epitaxial structure layer comprises first connecting structures and second connecting structures, the first connecting structures being located on one side of the gate line and the second connecting structures being located on another side of the gate line,
wherein a material of the second connecting layer, a material of the first connecting structures, and a material of the second connecting structures are the same.

2. The three-dimensional storage of claim 1, wherein the first connecting structures and the second connecting structures are staggered in a direction perpendicular to an extension direction of the gate line.

3. The three-dimensional storage of claim 2, wherein the first connecting structures are arranged in sequence on one side of the gate line, the second connecting structures are arranged in sequence on another side of the gate line, and any one of the first connecting structures and any one of the second connecting structures are staggered in the direction perpendicular to the extension direction of the gate line.

4. The three-dimensional storage of claim 1, wherein the channel structure comprises:

a barrier layer, a charge trapping layer, a tunneling layer, and the channel layer sequentially formed on a bottom and part of a sidewall of a channel hole.

5. The three-dimensional storage of claim 1, further comprising:

a conduction structure provided between the substrate and the first connecting layer.

6. The three-dimensional storage of claim 1, wherein the same material of the second connecting layer, the first connecting structures, and the second connecting structures is polysilicon.

7. The three-dimensional storage of claim 1, wherein each of the channel structure and the gate line extends through the stacked structure into the first connecting layer, a bottom end of the channel structure and a bottom end of the gate line being positioned within the first connecting layer.

8. The three-dimensional storage of claim 1, wherein a material of the first connecting layer, the material of the second connecting layer, the material of the first connecting structures, and the material of the second connecting structures are the same.

9. The three-dimensional storage of claim 1, wherein a material of the first connecting layer, the material of the second connecting layer, the material of the first connecting structures, and the material of the second connecting structures are the same, the same material being polysilicon.

10. The three-dimensional storage of claim 1, wherein no channel structure is arranged between the first connecting structures and the second connecting structures disposed opposite the first connecting structures.

11. The three-dimensional storage of claim 1, wherein:

the gate line extends in a first lateral direction, and in a sectional view taken along a second lateral direction perpendicular to the first lateral direction, the gate line has a line configuration; and the first connecting structures and the second connecting structures are staggered, in the second lateral direction, at opposite sides of the gate line.

12. The three-dimensional storage of claim 1, wherein:

the gate line extends in a first lateral direction, and in a sectional view taken along a second lateral direction perpendicular to the first lateral direction, the gate line has a line configuration; and a bottom end of the gate line is positioned within the first connecting layer.

13. The three-dimensional storage of claim 1, wherein:

the gate line extends in a first lateral direction, and in a sectional view taken along a second lateral direction perpendicular to the first lateral direction, the gate line has a line configuration; and the gate line comprises a metal material.

14. The three-dimensional storage of claim 1, wherein:

a bottom end of the gate line is lower than the first connecting structures and the second connecting structures.

15. The three-dimensional storage of claim 1, wherein:

a bottom surface of the first connecting layer is lower than a bottom end of the channel structure.

16. The three-dimensional storage of claim 1, wherein:

the first connecting structures and the second connecting structures are sandwiched between the first connecting layer and the second connecting layer.

17. The three-dimensional storage of claim 1, wherein:

the gate line extends in a first lateral direction, and in a sectional view taken along a second lateral direction perpendicular to the first lateral direction, the gate line has a line configuration, the gate line being fully filled with a material containing metal.

18. The three-dimensional storage of claim 1, wherein:

a number of the gate line arranged between the first connecting structures and the second connecting structures is one.

19. The three-dimensional storage of claim 1, wherein:

a number of the gate line arranged between the first connecting structures and the second connecting structures is one; and the gate line extends in a first lateral direction, and in a sectional view taken along a second lateral direction perpendicular to the first lateral direction, the gate line has a line configuration.

20. The three-dimensional storage of claim 1, wherein:

a number of the gate line arranged between the first connecting structures and the second connecting structures is one; and no channel structure is arranged between the first connecting structures and the second connecting structures disposed opposite the first connecting structures.

* * * * *